United States Patent
Emoto et al.

(10) Patent No.: US 9,435,642 B2
(45) Date of Patent: Sep. 6, 2016

(54) POSITION MEASURING APPARATUS, PATTERN TRANSFER APPARATUS, AND METHOD FOR MANUFACTURING A DEVICE

(71) Applicant: CANON KABUSHIKI KAISHA, Tokyo (JP)

(72) Inventors: Keiji Emoto, Saitama (JP); Naoki Maruyama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/863,735

(22) Filed: Apr. 16, 2013

(65) Prior Publication Data
US 2013/0293889 A1    Nov. 7, 2013

(30) Foreign Application Priority Data

Apr. 20, 2012  (JP) .................. 2012-096941
Apr. 20, 2012  (JP) .................. 2012-096942

(51) Int. Cl.
| | |
|---|---|
| G01B 11/00 | (2006.01) |
| G01B 11/27 | (2006.01) |
| G01B 7/00 | (2006.01) |
| H01L 21/67 | (2006.01) |
| H05K 3/00 | (2006.01) |
| G03F 7/00 | (2006.01) |

(52) U.S. Cl.
CPC ............. G01B 11/27 (2013.01); G01B 7/00 (2013.01); *G03F 7/0002* (2013.01); *H01L 21/67259* (2013.01); *H05K 3/0008* (2013.01); *H05K 2203/166* (2013.01)

(58) Field of Classification Search
CPC .... G03F 7/70633; G03F 7/70; G03F 9/7076; G03F 9/7088; G03F 9/7049
USPC .......................................................... 356/401
See application file for complete search history.

(56) References Cited

U.S. PATENT DOCUMENTS

| | | | | |
|---|---|---|---|---|
| 3,678,270 A | * | 7/1972 | Braun .................. | H01J 37/023 250/442.11 |
| 5,902,964 A | * | 5/1999 | Solberg, Jr. ............. | G01G 3/16 177/1 |
| 5,931,441 A | * | 8/1999 | Sakamoto ............... | F16F 15/02 248/550 |
| 6,665,053 B2 | * | 12/2003 | Korenaga ............... | F16C 39/06 310/12.31 |
| 6,947,657 B1 | * | 9/2005 | Chen et al. ................... | 385/140 |
| 7,903,866 B2 | * | 3/2011 | Van Der Wijst et al. .... | 382/144 |
| 2002/0012108 A1 | * | 1/2002 | Hara ................... | G03F 7/70725 355/53 |
| 2003/0213382 A1 | * | 11/2003 | Kendale et al. ................ | 101/41 |
| 2004/0179192 A1 | * | 9/2004 | Mizuno .................. | G02B 7/005 356/139.1 |
| 2007/0273074 A1 | | 11/2007 | Mizuno | |
| 2008/0068603 A1 | * | 3/2008 | Nawata .................. | G03B 27/53 356/244 |
| 2011/0141447 A1 | * | 6/2011 | Van Der Wijst et al. ...... | 355/67 |

FOREIGN PATENT DOCUMENTS

| | | |
|---|---|---|
| JP | 2001284438 A | 10/2001 |
| JP | 2009-004737 A | 1/2009 |

(Continued)

*Primary Examiner* — Tarifur Chowdhury
*Assistant Examiner* — Md M Rahman
(74) *Attorney, Agent, or Firm* — Canon USA, Inc. IP Division

(57) ABSTRACT

A position measuring apparatus configured to measure a position of an measured object using a plate-like scale including a grating pattern, includes a supporting unit configured to be arranged between a structure and the scale and to support the scale, in which the supporting unit includes a spring element that reduces vibration transferred from the structure to the scale in a plate thickness direction.

8 Claims, 11 Drawing Sheets

(56) References Cited

FOREIGN PATENT DOCUMENTS

| JP | 2012049532 A | 3/2012 |
| KR | 10-2008-0082918 A | 9/2008 |
| KR | 20080088501 A | 10/2008 |
| WO | WO 2005026573 A1 * | 3/2005 |

* cited by examiner

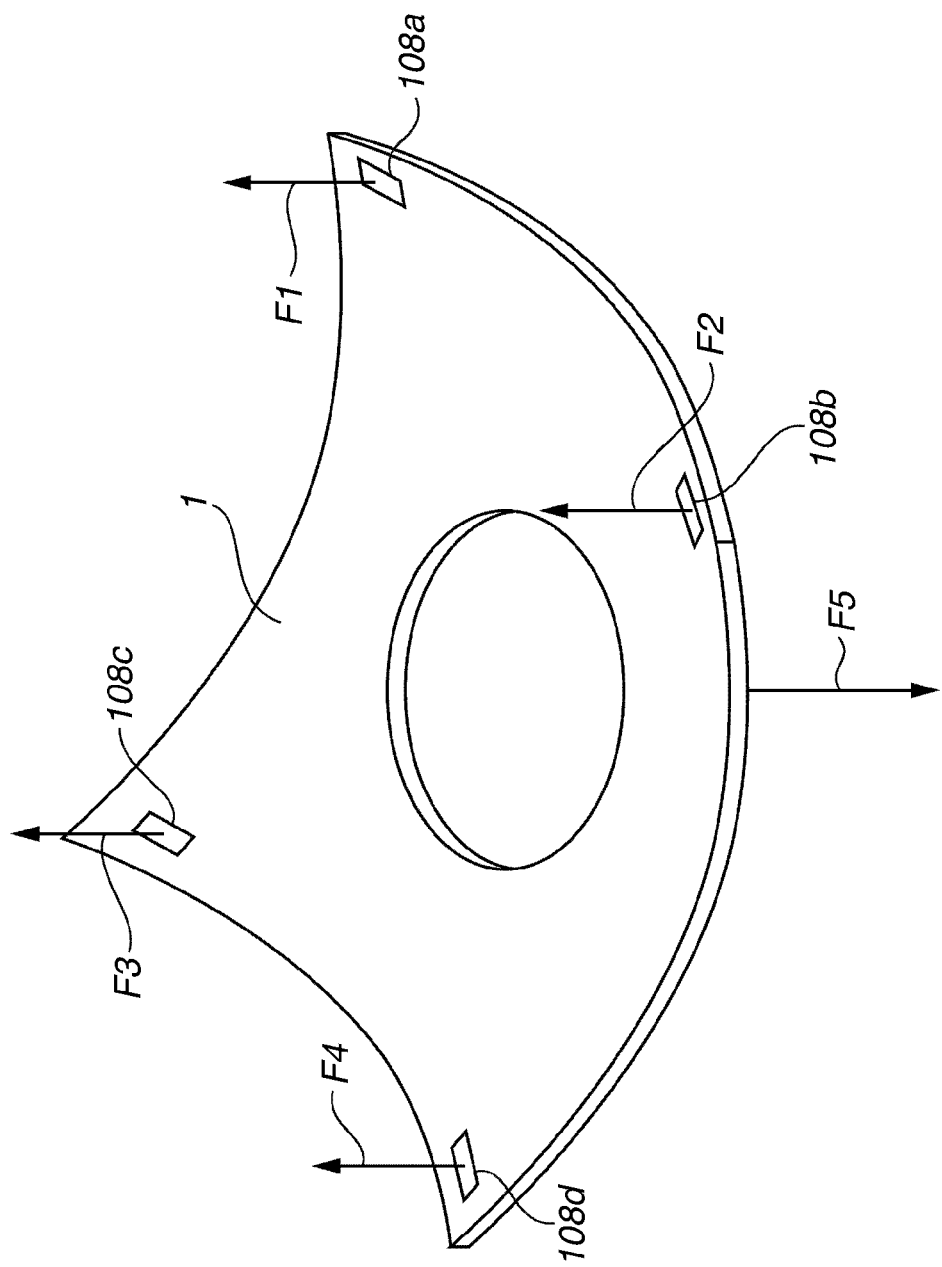

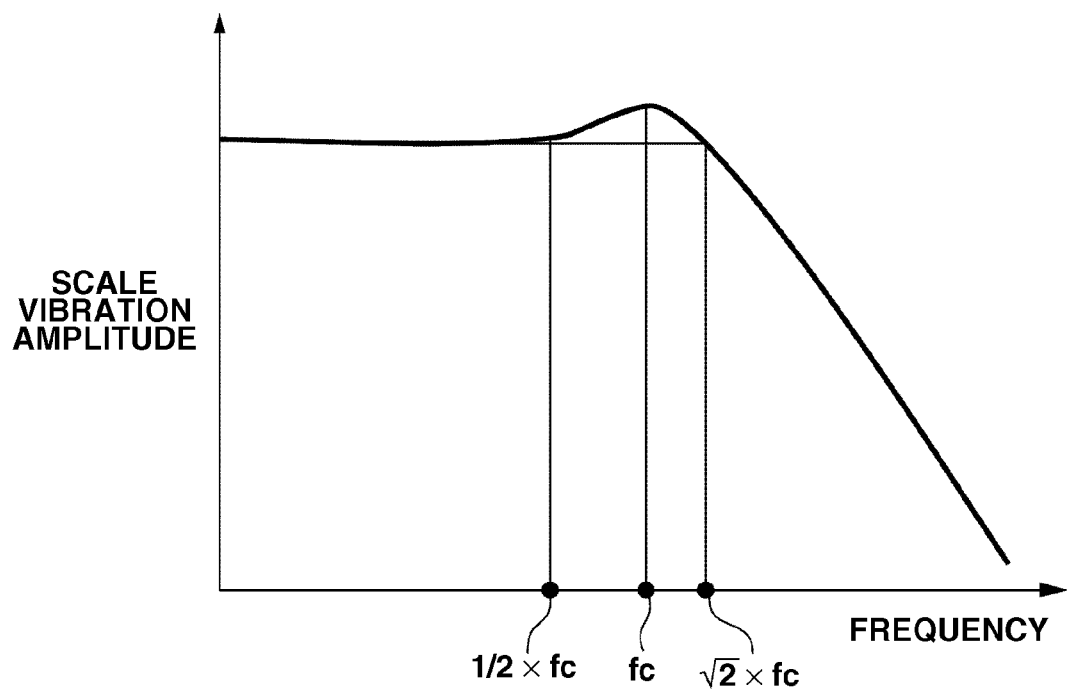

US 9,435,642 B2

POSITION MEASURING APPARATUS, PATTERN TRANSFER APPARATUS, AND METHOD FOR MANUFACTURING A DEVICE

BACKGROUND OF THE INVENTION

1. Field of the Invention

The present invention relates to a position measuring apparatus that uses a plate-like scale having a grating pattern to measure a position of a measured object. Further, the present invention relates to a pattern transfer apparatus using the position measuring apparatus. In addition, the present invention relates to a device measuring method using the pattern transfer apparatus.

2. Description of the Related Art

A projection exposure apparatus that transfers a circuit pattern formed on an original to a substrate via a projection optical system has been used from the past. In recent years, the demand for a higher-resolution and cheaper exposure apparatus has been being gradually increased. One of the important performances of the exposure apparatus may include a superposition precision when the circuit pattern is transferred to the substrate. Generally, a plurality of circuit patterns are formed on the substrate in a multi layer, however unless the plurality of circuit patterns is aligned with each other in a predetermined precision, an electronic circuit may not be realized.

Therefore, a technology for accurately aligning a substrate at the time of exposure is important. As one of the technologies for aligning a substrate, a position measuring apparatus measuring a position of a moving stage mounted with the substrate by using a plate-like scale having a grating pattern have been discussed.

Japanese Patent Application Laid-Open No. 2009-004737 discusses a position measuring apparatus that includes a scale fixed to a lens barrel surface plate and a sensor fixed on a stage. Further, Japanese Patent Application Laid-Open No. 2009-004737 discusses that the scale is coupled with the lens barrel surface plate via a deflection element.

In the position measuring apparatus, a plurality of deflection elements are arranged on a virtual circle, centered on a central axis of a lens barrel. Each deflection element has flexibility in a diameter direction to prevent the scale from displacing even if the lens barrel is deformed due to a temperature change.

In the exposure apparatus of the related art, the lens barrel surface plate may be supported on a floor surface via an anti-vibration apparatus, such as an air mount, and the like, and therefore vibration transferred from a floor to the lens barrel surface plate may be disregarded. In recent years, however, a precision required for the exposure apparatus has been increased and the vibration that is not completely removed by the air mount to be transferred to the lens barrel surface plate has been concerned.

In particular, in the position measuring apparatus using the scale, the scale is often mounted on a structure, such as the lens barrel surface plate, so that it is concerned that vibration may be transferred to the scale from the structure. In particular, since the scale has a structure easily deformed in a plate thickness direction, a deformation amount may be increased when vibration is transferred in the direction. In this case, even if a vibration frequency is sufficiently smaller than a natural frequency of the scale, an inertial force in response to an acceleration generated in the scale may be applied to the scale, and thus there is fear that the deformation of the scale may be increased.

A position measuring apparatus discussed in Japanese Patent Application Laid-Open No. 2009-004737 has a structure in which a deflection element has flexibility in a diameter direction but a plate thickness direction of the scale is not considered and vibration is easily transferred to the scale from the lens barrel surface plate via the deflection element.

SUMMARY OF THE INVENTION

The present invention is directed to improve a measurement precision by reducing a deformation in a plate thickness direction of a scale, in a position measuring apparatus using a plate-like scale having a grating pattern.

According to an aspect of the present invention, a position measuring apparatus configured to measure a position of a measured object using a plate-like scale including a grating pattern, includes a supporting unit configured to be arranged between a structure and the scale and to support the scale, in which the supporting unit includes a spring element that reduces vibration transferred from the structure to the scale in a plate thickness direction.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 4 is an example of deformation of a scale.

FIG. 9 is a diagram illustrating vibrations transferred to the scale from a lens barrel surface plate via the supporting apparatus for each frequency.

DESCRIPTION OF THE EMBODIMENTS

Various exemplary embodiments, features, and aspects of the invention will be described in detail below with reference to the drawings.

Figure 1:
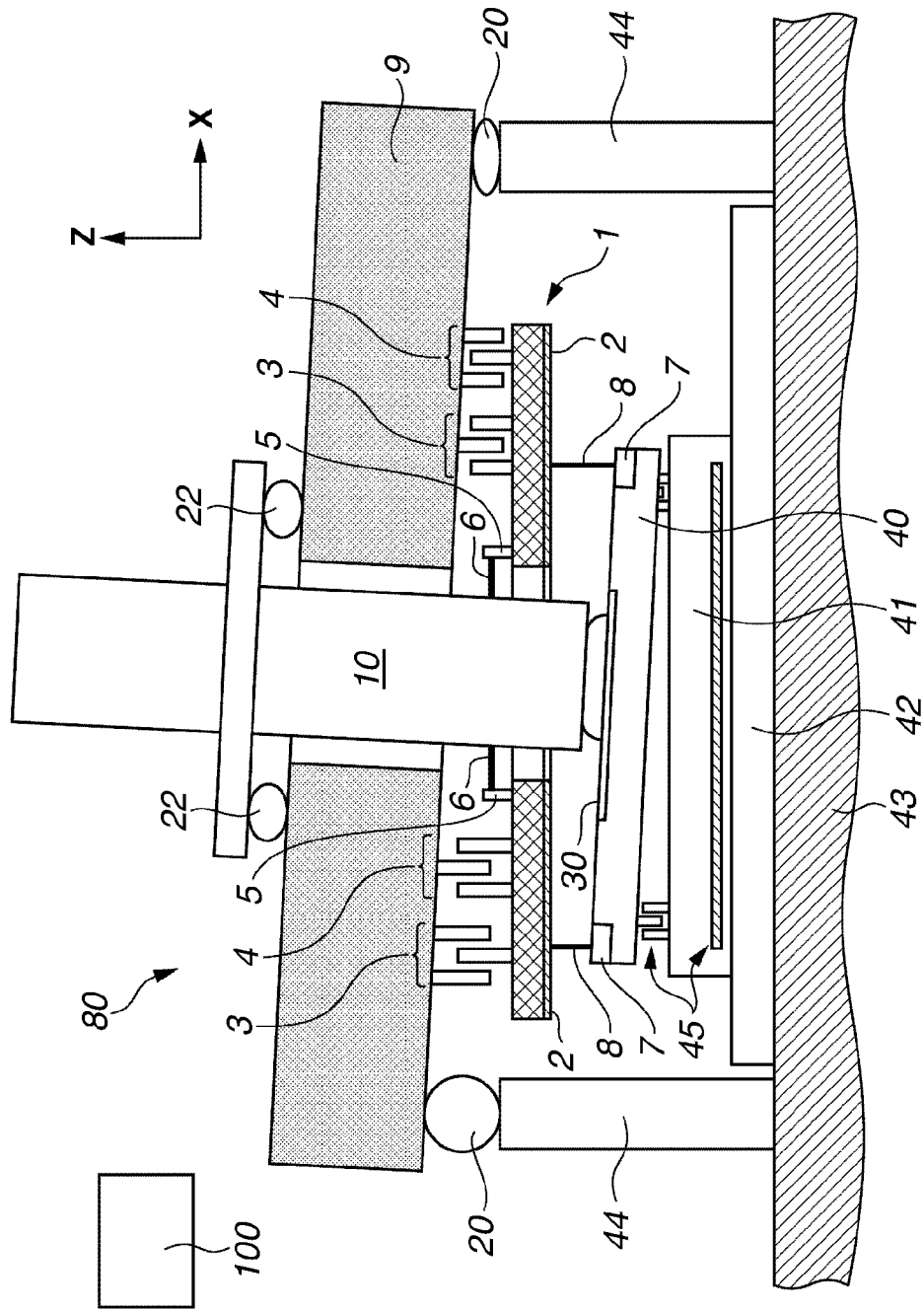
FIG. 1 is a schematic diagram of an immersion exposure apparatus to which the present invention is applied.

A first exemplary embodiment will now be described. An exposure apparatus according to the first exemplary embodiment will be described with reference to drawings. Further, in drawings, component represented by reference numerals with alphabet is a part of components represented by the same reference numerals without alphabet. In addition, an optical axis direction of exposure light of the exposure apparatus is set to be a Z direction, and directions that are orthogonal to each other, being orthogonal to a Z direction are set to be an X direction and a Y direction. FIG. 1 is a diagram illustrating an immersion exposure apparatus 80 according to the first exemplary embodiment. A pattern formed on an original (not illustrated) forms image (exposes) on a substrate 30 via a projection optical system 10. In the immersion exposure apparatus, exposure is performed in a state in which a space between the projection optical system 10 and the substrate 30 is filled with a liquid.

The original collectively refers a member on which a pattern is formed, for example, a mask or a reticle. A substrate collectively refers an exposed member, for example, a wafer or a glass substrate. The substrate 30 is mounted on a substrate stage (moving body), and a substrate stage is positioned by a driving apparatus and a position measuring apparatus to be described below. The projection optical system 10 includes a plurality of optical elements and a lens barrel enclosing the optical elements, and is supported on a lens barrel surface plate 9 (structure) via an vibration isolation apparatus 22. The lens barrel surface plate may be referred to as a support that supports the projection optical system. As the plurality of optical elements, for example, a lens or a mirror or a combination thereof may be applied. The lens barrel surface plate 9 is mounted on a floor via a columnar member 44 and an vibration isolation apparatus 20. The vibration isolation apparatuses 20 and 22 are mounted to suppress vibration or deformation from being transferred. For example, a mount using an air pressure, equipment generating force using electricity or magnetism, an elastic member, and the like, may be applied. Further, the anti-vibration apparatus may be a passive type or an active type.

In the present exemplary embodiment, the substrate stage includes a coarse motion stage 41 that can move in an XY direction with a long stroke with respect to a base surface plate 42. Further, the substrate stage also includes a fine motion stage 40 that can move in X, Y, and Z directions and in rotation directions around an axial parallel with each of X, Y, and Z directions, ωx, ωy and ωz directions (hereinafter, referred to as six axis directions), with a short stroke with respect to the coarse motion stage 41. However, the present invention is not limited thereto, and therefore the substrate stage may be configured with one stage used as the coarse motion stage and the fine motion stage. In addition, a driving apparatus 45 (driving unit) (for the coarse motion stage and for the fine motion stage in drawings) is mounted to drive the substrate stage, for example, a linear motor may be advantageously used. The driving apparatus 45 is controlled by a control unit 100. The control unit 100 may include a central processing unit (CPU) or a micro processing unit (MPU), a read-only memory (ROM), a random access memory (RAM), a recording unit, a driver, and the like, and the configuration thereof is not particularly limited.

The position in the six axis directions of the substrate stage is measured by a position measuring apparatus. In other words, the substrate stage is a measured object.

The position measuring apparatus includes a sensor 7 (first position sensor) mounted on the substrate stage and a plate-like scale 1 supported on a lens barrel surface plate 9. The sensor 7 may be called an encoder head or a sensor head. As the scale 1, various scales in the known position measuring apparatus may be applied. In the exemplary embodiment, the scale 1 includes a diffraction grating 2 (grating pattern). The diffraction grating 2 may be formed on a plate-like member and the member formed with the diffraction grating may also be attached to the plate-like member. The sensor 7 measures a relative position between the substrate stage and the scale 1, and the driving apparatus 45 is controlled to drive the substrate stage based on an output from the sensor 7. For example, a feedback control, and the like, using a known PID compensation may be applied.

Further, the position measuring apparatus includes a supporting apparatus 3 (supporting unit) that supports the scale and a driving apparatus 4 (driving unit) that drives the scale 1 in six axis directions with respect to the lens barrel surface plate 9. The supporting apparatus 3 is arranged between the lens barrel surface plate 9 and the scale 1. In addition, the position measuring apparatus includes a position sensor 5 (second position sensor) that measures a relative position in six axis directions of the scale 1 with respect to the lens barrel of the projection optical system 10. The position sensor 5 is mounted on an object that is supported by the supporting apparatus 3 and is enough to measure the relative position between a reference object (herein, lens barrel), which is a reference at the time of measuring the position of the substrate stage, and the scale 1. Further, in drawings, the position sensor 5, a part of the sensor 7, and measurement optical axes 6 and 8 thereof are illustrated by way of example.

The supporting apparatus 3 is configured to reduce a transfer of vibration from the lens barrel surface plate 9 to the scale 1, in a plate thickness direction (Z) of the scale 1, two directions (X and Y) that are parallel with a plate surface of the scale 1 and orthogonal to each other, and rotation directions (θx, θy, and θz) that set axes parallel with each direction as rotating axes.

Figure 2A:
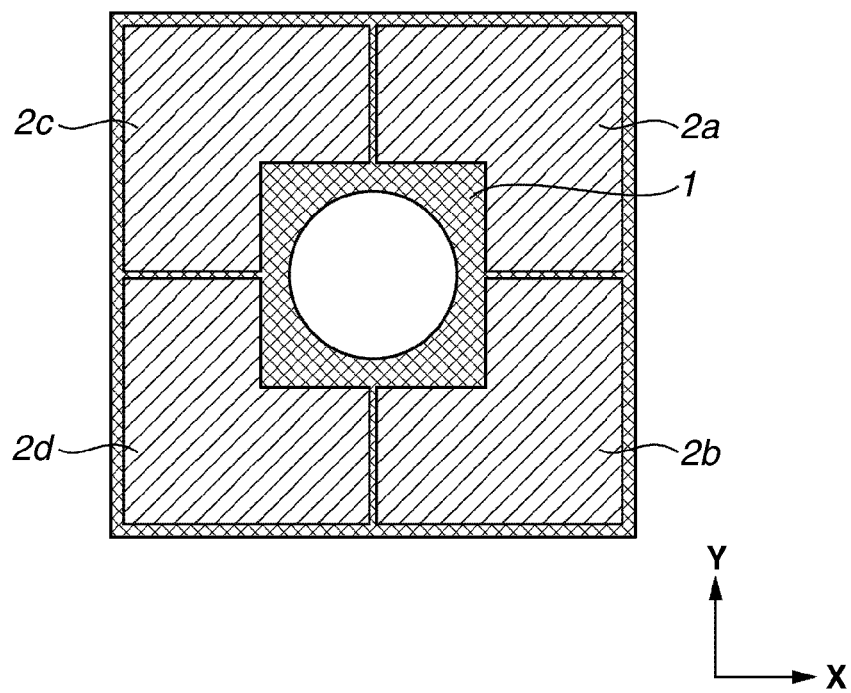
FIG. 2A is a bottom view of a scale according to the present invention.

FIG. 2A is a bottom view (a diagram viewed from a −Z direction) of the scale 1. In the present exemplary embodiment, the scale 1 includes four sheets of plates 2a, 2b, 2c, and 2d (represented by reference numeral 2 in FIG. 1) on which the diffraction grating is formed and a plate-like member to which these plates are attached. The diffraction grating is irradiated with light from the sensor 7, such that a light receiving element (not illustrated) measures the position of the substrate stage according to a diffracted light.

Figure 2B:
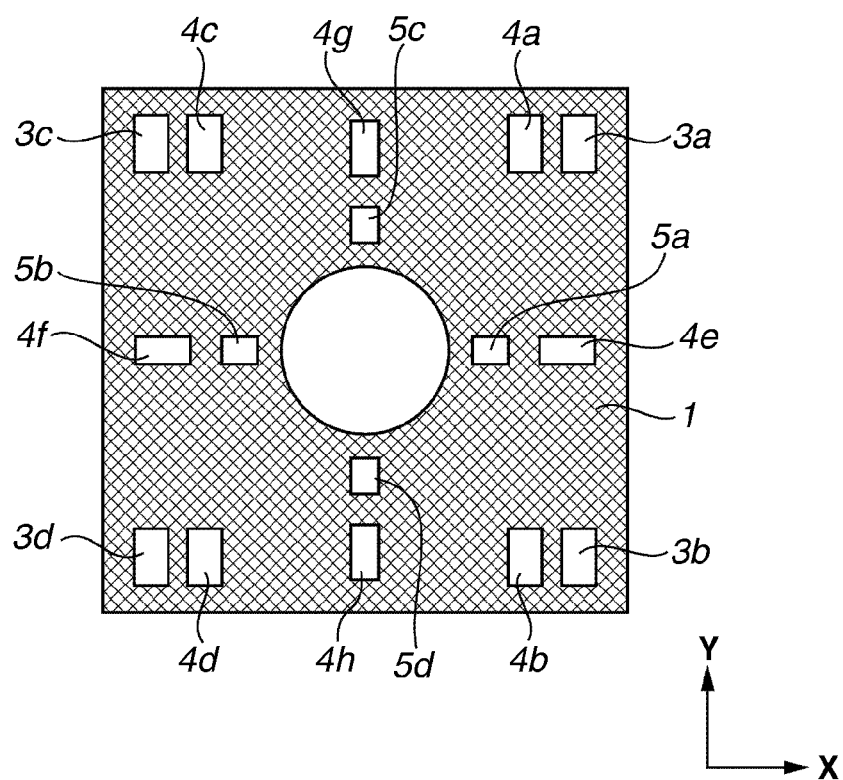
FIG. 2B is a top view of the scale according to the present invention.

FIG. 2B is a top view (a diagram viewed from a +Z direction) of the scale 1. Position sensors 5a to 5d (represented by reference numeral 5 in FIG. 1) is mounted on the scale 1. As the position sensors 5a to 5d, for example, a capacitance sensor, an interferometer, and a linear encoder may be used. The position sensors 5a and 5b each can measure the positions in the X direction and the Z direction of the scale 1 with respect to the projection optical system 10, and the position sensors 5c and 5d each can measure the positions of the Y direction and the Z direction of the scale 1 with respect to the lens barrel of the projection optical system 10. The rotation directions (θx, θy, and θz directions) can be obtained by a difference between two outputs from position sensors. Further, an average value of the outputs from the position sensors that are redundantly mounted may be set as a measured value. The number and arrangement of position sensors are not limited thereto and are enough to measure the position of the six axis directions of the scale 1 with respect to the lens barrel of the projection optical system 10. In addition, the position measurement of the scale 1 is discussed in Japanese Patent Application Laid-Open No. 2009-27141.

Further, the scale 1 and the lens barrel surface plate 9 are mounted with driving apparatuses 4a to 4h (represented by reference numeral 4 in FIG. 1) and supporting apparatuses 3a to 3d (represented by reference numeral 3 in FIG. 1). As the driving apparatuses 4a to 4h, a non-contact driving apparatus having a vibration isolation effect is advantageously applied. An example of the driving apparatus may include a Lorenz type linear motor, an electromagnetic actuator, and the like. In addition, the driving apparatuses 4a to 4h are controlled by the control unit 100. The control of the driving apparatuses 4a to 4h will be described below. Further, a cooling unit that cools the driving apparatus may also be provided.

Figure 3A:
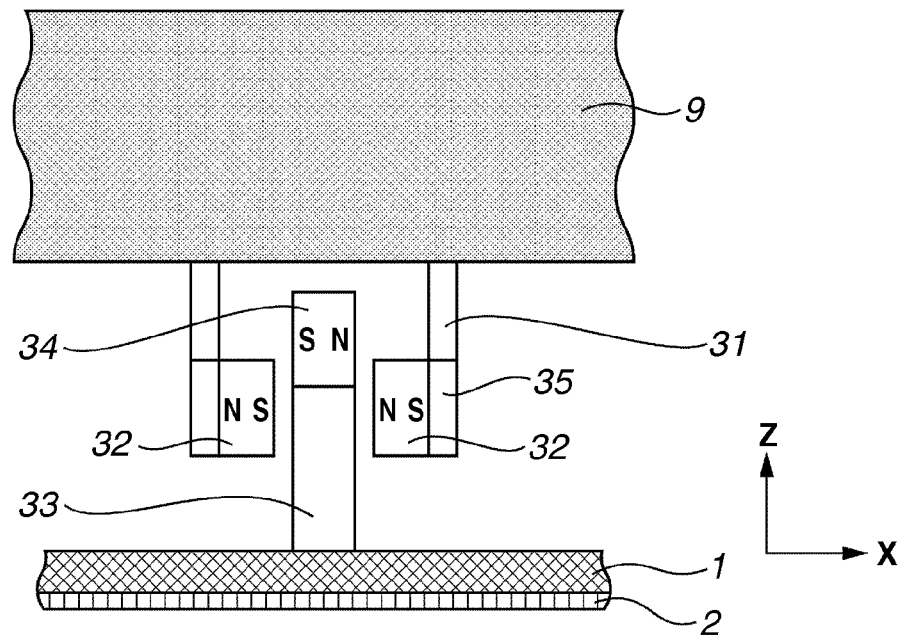
FIGS. 3A and 3B are schematic diagrams of a supporting apparatus according to the present invention.
Figure 3B:
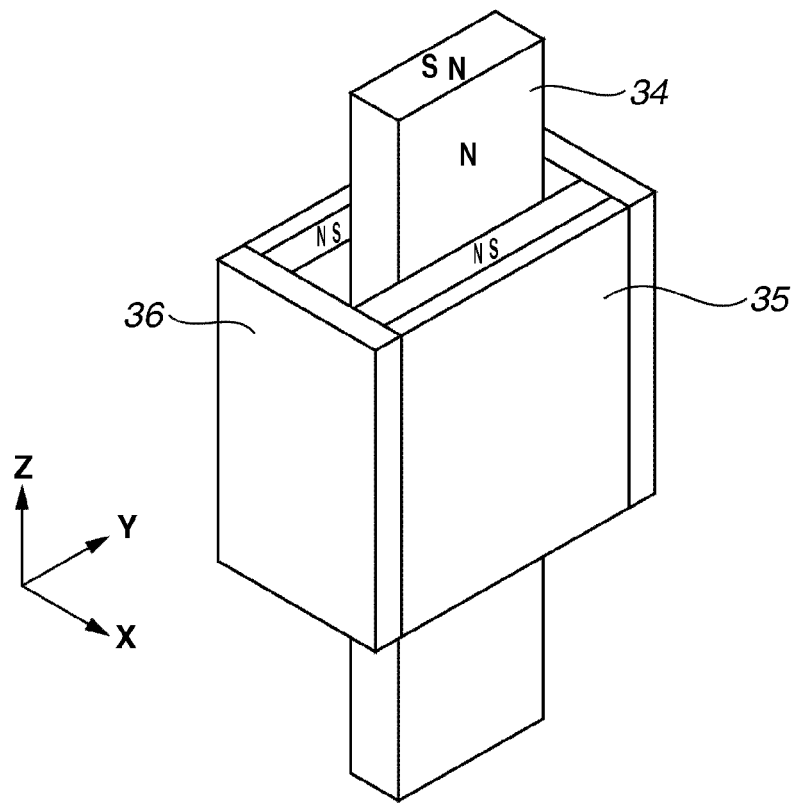

FIG. 3A is a diagram illustrating a detail of the supporting apparatus 3a and FIG. 3B is a perspective view thereof. A configuration of supporting apparatuses 3b, 3c, and 3d is the same as that of the supporting apparatus 3a and the description thereof will be omitted.

The supporting apparatus 3a includes a pair of magnets 32 (first magnet) that is fixed to the lens barrel surface plate 9 via a support member 31 and a magnet 34 (second magnet) that is fixed to the scale 1 via a support member 33. The pair of magnets 32 is arranged to face each other with a gap arranged therebetween, and the magnet 34 is arranged between the pair of magnets 32 inserted in a non-contact manner. In the present exemplary embodiment, the magnet 32 may be arranged at the lens barrel surface plate 9 side (structure side) and the magnet 34 may be arranged at the scale 1 side, and vice versa. Each magnet is a permanent magnet and is magnetized in a plate thickness direction of the magnet, that is, an X direction, and the magnets 32 and 34 are arranged to face the same pole thereof.

The supporting apparatus 3a advantageously includes yokes 35 and 36 for strengthen a flux of a magnetic circuit that is formed by the magnet 32. An example of a material of the yoke may include a soft magnetic member, such as iron.

The magnet 34 is subjected to a levitation force in a +Z direction by a magnetic repulsion force between the pair of magnets 32 and the magnet 34. The magnets 32 and 34 serve as a spring element to reduce vibration transferred from the lens barrel surface plate 9 to the scale 1. Further, a repulsion force in the X direction impinging between one of the magnets 32 and the magnet 34 is offset from a repulsion force applied between the other magnet and the magnet 34.

The number and arrangement of supporting apparatuses and driving apparatuses are not limited to the illustrated form. In the present exemplary embodiment, linear motors 4e and 4f that can be driven in the X direction are arranged in a line symmetry with respect to a Y-axis line that passes through a center of gravity of the scale 1. Further, linear motors 4g and 4h that can be driven in the Y direction are arranged in a line symmetry with respect to an X-axis line that passes through a center of gravity of the scale 1. The linear motors 4a to 4d that can be driven in the Z direction are arranged at four corners of the scale 1. In addition, in order to apply a force symmetrical with the scale 1, both the supporting apparatus and the driving apparatus advantageously have symmetry. A deformation is easily suppressed or predicted and corrected by allowing the apparatuses to have symmetric property.

Figure 10:
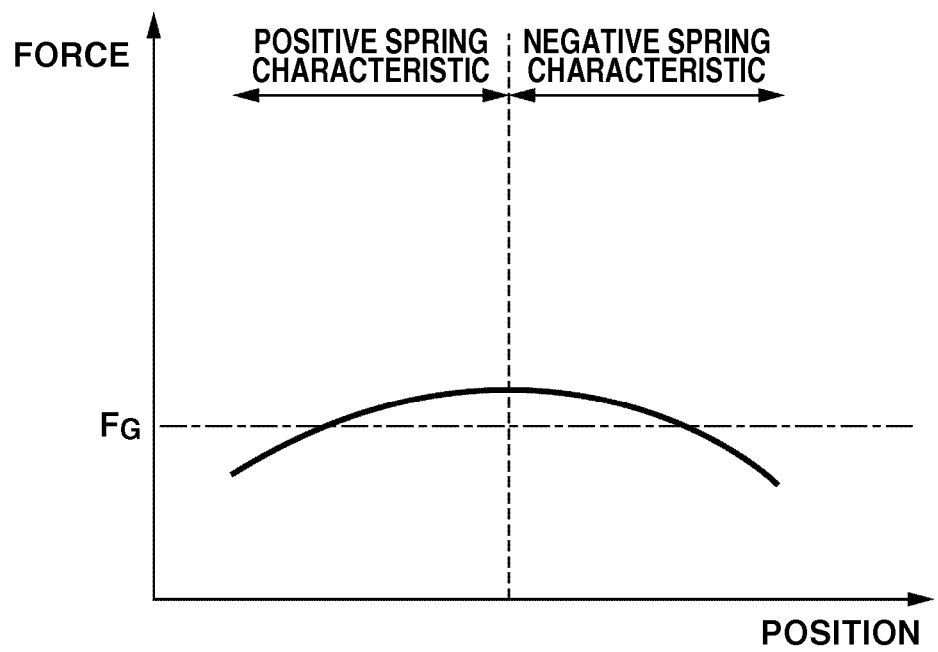
FIG. 10 is a diagram illustrating a positive spring characteristic and a negative spring characteristic of the supporting apparatus.

Hereinafter, characteristics of the supporting apparatus according to the present exemplary embodiment will be described below. FIG. 10 is a diagram illustrating a relationship between the position in the plate thickness direction (Z direction) of the scale 1 and the force in the plate thickness direction which the supporting apparatus 3a applies to the scale 1, when the scale 1 is supported by using the supporting apparatus 3a (likewise in 3b to 3d) illustrated in FIGS. 3A and 3B. FG is a gravity that is applied to the scale 1 supported by the supporting apparatus 3a. The supporting apparatus 3a has a negative spring characteristic and a positive spring characteristic according to a position in the plate thickness direction of the scale 1. Herein, the "negative spring characteristic" is a characteristic that generates force in a direction far away from a balance position, if an object deviates from the balance position at the time of supporting the object. Unlike this, the "positive spring characteristic" is a characteristic that generates force returning an object to a balance position when an object deviates from the balance position at the time of supporting the object.

In the first exemplary embodiment, the supporting apparatus is used at a position where an absolute value of a spring constant is small, having the positive spring characteristic. Further, the supporting apparatus 3a is configured so that the absolute value of the spring constant becomes smaller in the plate thickness direction (Z direction) of the scale as well as the six axis directions. In other words, the scale 1 is supported in a vibration isolation state.

Since the scale 1 has a plate shape, the scale 1 may be easily deformed mainly by an inertial force applied in the plate thickness direction of the scale 1 in material mechanical properties. FIG. 4 illustrates the shape of the scale 1 when vibration is transferred from the lens barrel surface plate, in the supporting apparatus to which the scale 1 is rigidly supported (fixed) in the plate thickness direction. Forces F1 to F4 impinges on support portions 108a to 108d in the scale 1, and the forces generate an acceleration in the overall scale 1 to generate inertial force F5. As the result, the deformation illustrated in FIG. 4 occurs.

Further, the inertial force F5 generated in the scale 1 is represented by [mass of scale]×[vibration amplitude]×[angular frequency of vibration]^2. In other words, the inertial force is in proportion to the vibration amplitude, while the inertial force has a proportional relation to the angular frequency [rad/s] of the vibration or a square of the vibration frequency [Hz] that is in proportion to the angular frequency. Therefore, reducing the vibration of the high frequency transferred to the scale 1 is effective to reduce the deformation of the scale 1.

Since the recent exposure apparatus requires a precision of about 0.1 nm to measure the position of the substrate stage, there is a need to set the deformation of the scale 1 to equal to or less than 0.1 nm. According to the analysis result, if a plate thickness of the scale 1 is several tens of mm, it is only necessary that the natural frequency in the plate thickness direction of the supporting apparatus 3 is set to equal to or less than 10 Hz so as to suppress the deformation of the scale 1 due to the vibration in the plate thickness direction to equal to or less than 0.1 nm. Herein, when the scale 1 has a configuration to be rigidly supported in the plate thickness direction, the natural frequency becomes equal to or more than 100 Hz, which is not advantageous. In the present exemplary embodiment, the scale 1 is supported by the supporting apparatus 3 using a repulsion force of a magnet to cause the spring constant to be small, so that the natural frequency of equal to or less than 10 Hz is realized. As the result, it is possible to remarkably reduce the deformation of the scale 1 due to the transfer of vibration from the lens barrel surface plate to the scale 1.

Next, in the present exemplary embodiment, the positioning control of the scale 1 using the driving apparatus 4 will be described. The supporting apparatus 3 according to the present exemplary embodiment has the small absolute value of the spring constant to be hardly generate the acceleration in the scale 1, while the position stability of the scale 1 is poor. For example, the scale 1 is possibly displaced even by the effect of wind pressure involved in the movement of the substrate stage. Therefore, in the driving apparatus 4 according to the present exemplary embodiment, both of the position stability of the scale 1 and the suppression of acceleration generated in the scale 1 may be achieved.

For describing the positioning control according to the present exemplary embodiment, the relationship between the supporting apparatus 3 and the positioning control will first be described.

In the present exemplary embodiment, the relative position of the scale 1 in the six axis directions with respect to the lens barrel of the projection optical system 10 is measured by the position sensor 5, and the driving apparatus 4 is controlled in the six axis directions based on the measured result so that the relative position therebetween has a predetermined relationship. Specifically, a feedback control using the PID compensation is applied.

However, when the scale 1 follows up the lens barrel of the projection optical system 10 by performing the positioning control of the scale 1, there is fear that the positioning control of the scale 1 amplifies vibration.

FIG. 9 illustrates a vibration transfer rate transferred from the lens barrel surface plate 9 to the scale 1. A horizontal axis represents a frequency, a vertical axis represents an amplitude of the scale 1 due to the vibration, and both axes are expressed on a logarithmic scale. In the drawings, a natural frequency of the supporting apparatus 3 is set to be fc.

The natural frequency of the supporting apparatus 3 is a frequency [Hz] that is determined by the spring constant of the supporting apparatus 3 and the mass of the scale 1 and is set to be 2 Hz in the present exemplary embodiment.

In a region (for example, equal to or less than 0.5 Hz) in which the vibration frequency of the lens barrel surface plate 9 is sufficiently lower than the natural frequency fc, the lens barrel surface plate 9 and the scale 1 are vibrated as if they are the integrated structure, so that the vibrations of both the lens barrel surface plate 9 and the scale 1 have the approximately same amplitude and phase. Further, if the projection optical system 10 is supported to the lens barrel surface plate 9 by a spring element having the natural frequency (for example, 10 Hz) sufficiently higher than that of the supporting apparatus 3, the projection optical system 10 and the lens barrel surface plate 9 are vibrated like an integrated structure. That is, all of the projection optical system 10, the lens barrel surface plate 9, and the scale 1 are vibrated like the integrated structure.

In the region (for example, 0.5 Hz to 3 Hz) in which the vibration frequency of the lens barrel surface plate 9 is in the vicinity of fc, the vibration of the lens barrel surface plate 9 is amplified as much as an amount in proportion to a damping ratio of the supporting apparatus 3 and is transferred to the scale 1.

In a region (for example, equal to or more than 3 Hz) in which the vibration frequency of the lens barrel surface plate 9 is sufficiently higher than the natural frequency fc, it is difficult to transfer the vibration of the lens barrel surface plate 9 to the scale 1.

As such, since the vibration is easily amplified (that is, easily resonated) in the region in the vicinity of the natural frequency fc, in the positioning control of the scale, there is a need to set the vibration to a servo control frequency sufficiently lower than the natural frequency fc. Therefore, in the present exemplary embodiment, as an example, the natural frequency fc of the supporting apparatus 3 is set to about 2 Hz in the six axis directions and the servo control frequency is set to a half or less of the natural frequency fc to avoid a resonance. Advantageously, the servo control frequency may be set to equal to or less than ¼ (for example, 0.5 Hz) of the natural frequency fc.

The "servo control frequency" (also referred to as servo control band) is defined by a zero cross frequency in an open characteristic and becomes an index that indicates a boundary as to whether a follow-up control is sufficiently operated. Specifically, if the servo control frequency is set to be 0.5 Hz, the follow-up control may not be performed on a motion of a frequency equal to or more than 0.5 Hz, but performed on a motion of a frequency less than 0.5 Hz to prevent a drift of a low frequency band at a position of the scale 1.

The positioning control is performed on only the frequency domain in which the projection optical system 10, the lens barrel surface plate 9, and the scale 1 are integrally vibrated in nature, by setting (0.5 Hz) the servo control frequency to be lower than the natural frequency of 2 Hz of the supporting apparatus 3. For this reason, the scale 1 originally follows up the motion of the projection optical system 10 even if the positioning control is not performed, and therefore the positioning control does not have any meaning. In an ideal case where the force applied to the scale 1 is generated only by the supporting apparatus 3, the positioning control does not have any meaning. Actually, however, a force transferred from a cable such as a sensor mounted on the scale 1 or a force generated by a non-uniform pressure change around the scale 1 due to the movement of the stage 40 under the scale 1 is applied to the scale 1. A positional relationship between the scale 1 and the projection optical system 10 is slowly misaligned due to the forces. In other words, a drift phenomenon in which the scale 1 is displaced in the considerably low frequency (for example, equal to or less than 0.1 Hz) may occur. For example, if a gap between the position sensor 5 and the projection optical system 10 is set to be about 0.3 to 0.5 mm, there is a need to suppress a gap change to 0.1 mm or less so as to maintain the high measurement precision of the position sensor 5 and the foregoing control is effective in reducing the gap change.

As described above, the supporting apparatus according to the present exemplary embodiment is configured to reduce the transfer of vibration from the lens barrel surface plate 9 in the plate thickness direction of the scale 1. Further, as an advantageous example, if the natural frequency of the supporting apparatus 3 in the plate thickness direction of the scale 1 is set to be fc, the servo control frequency is set to be equal to or less than ½ of the natural frequency fc when performing the positioning control on the scale 1. Therefore, the inertial force generated in the scale 1 by the positioning control of the scale 1 may be suppressed, and the deformation in the plate thickness direction of the scale 1 due to the vibration is remarkably reduced.

Further, in the present exemplary embodiment, the scale 1 is supported in a non-contact manner with respect to the lens barrel surface plate 9. Therefore, since the temperature change of the lens barrel surface plate 9 hardly transfers to the scale 1, the deformation of the scale 1 due to the temperature change may be reduced. Since the lens barrel surface plate used in the exposure apparatus has a surface area very much larger than that of the scale, the temperature change of about 100 mK may occur due to the temperature change of the surrounding environment. If the measurement error of the position measuring apparatus is to be maintained at equal to or less than 0.1 nm, the temperature change of the scale 1 needs to be suppressed to about 1 to 10 mK, so that making the scale non-contact to reduce a heat transfer amount is advantageous in terms of the measurement precision. In addition, although the present exemplary embodiment describes the position measurement in the six axis directions and the driving in the six axis directions by way of an advantageous example, the position measurement only in the plate thickness direction of the scale and the driving only in the plate thickness direction may be made. Further, in the present exemplary embodiment, the position sensor 5 measures the position of the scale 1 with respect to the projection optical system 10, but in place of this, the position of the scale 1 may be measured with respect to the lens barrel surface plate 9 (structure).

Further, in the present exemplary embodiment, the scale 1 is supported by the lens barrel surface plate 9, but may be supported by the structure other than the lens barrel surface plate 9. Even in this case, the structure is supported via the anti-vibration apparatus.

In the present exemplary embodiment, a configuration of an exposure apparatus 80 is one example and the exposure apparatus 80 may be differently configured without departing from a subject matter of the present invention. The exposure apparatus 80 may be advantageously applied to the pattern transfer apparatus that transfers a pattern to the substrate. An example of the pattern transfer apparatus may include an exposure apparatus, a charged particle beam drawing apparatus, and an imprint apparatus. Further, the position measuring apparatus according to the present exemplary embodiment may be applied to a digital microscope, and a position measuring apparatus used for a machine tool, in addition to the pattern transfer apparatus.

In a case where the foregoing position measuring apparatus is applied to the charged particle beam drawing apparatus, an electronic optical system for deflecting and shaping a charged particle beam may be applied, instead of the projection optical system.

In a case where the foregoing position measuring apparatus is applied to the imprint apparatus, a mold in which a pattern is formed or a support supporting the mold may be applied, instead of the projection optical system.

In a case where the foregoing position measuring apparatus is applied to the digital microscope, the optical system constituting the microscope may be applied, instead of the projection optical system.

Figure 5:
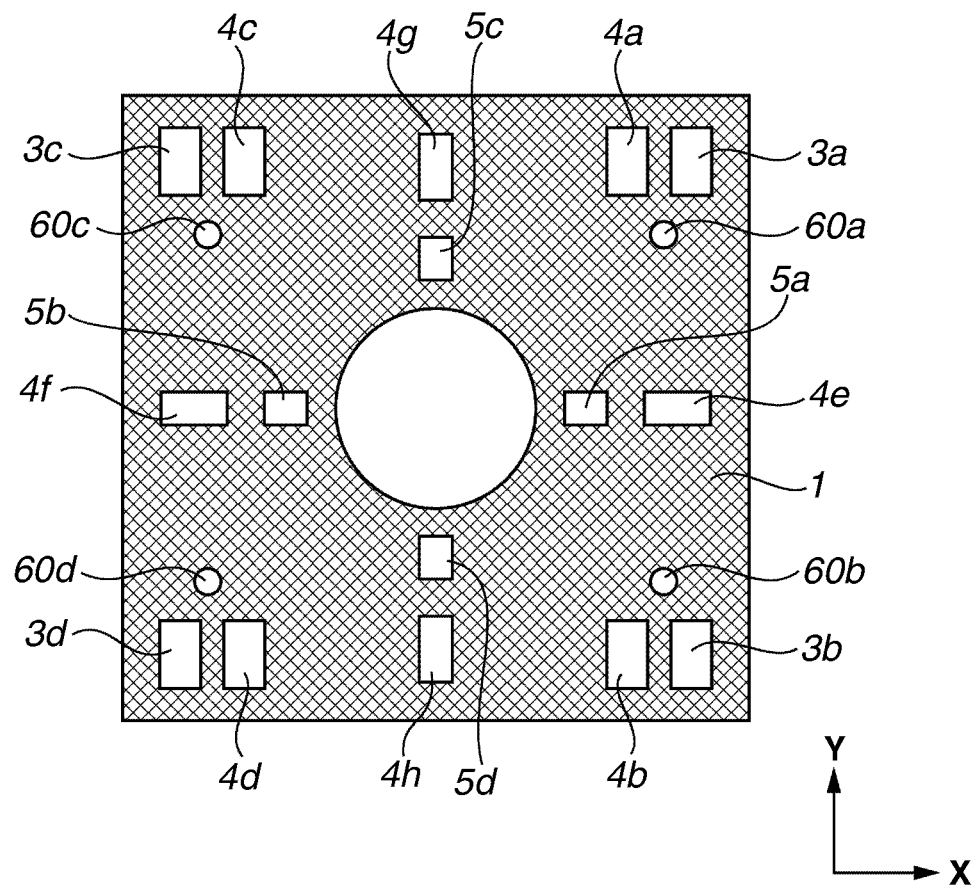
FIG. 5 is a top view of the scale according to the present invention.

A second exemplary embodiment will now be described. A position measuring apparatus according to the second exemplary embodiment will be described. In addition to the configuration of the first exemplary embodiment, an acceleration sensor 60 (acceleration measuring unit) is added to the scale 1, and the output from the acceleration sensor 60 is used to control the driving apparatus 4. In the following description, different portions from the first exemplary embodiment will be described and a description of portions having the same function as the first exemplary embodiment will be omitted. Further, it is only necessary that the acceleration sensor 60 is mounted on an object that is supported by the supporting apparatus 3. FIG. 5 is a top view of the scale 1 according to the second exemplary embodiment. In the drawing, portions having the same function as the first exemplary embodiment are denoted by the same reference numerals.

The acceleration sensors 60a to 60d that detect an acceleration in the plate thickness direction of the scale 1 are arranged on the scale 1. The control unit controls the driving apparatuses 4a to 4h based on the acceleration detected by acceleration sensors 60a to 60d to cancel the acceleration generated in the scale 1. In other words, the driving apparatus is controlled so that the outputs from the acceleration sensors 60a to 60d becomes 0.

In the present exemplary embodiment, the acceleration sensor detects an acceleration in the plate thickness direction of the scale 1, but may detect an acceleration in other directions (for example, six axis directions). In this case, the acceleration other than the plate thickness direction generated in the scale 1 can be canceled.

The foregoing acceleration control in the second exemplary embodiment is performed together with the position control for preventing the drift in the first exemplary embodiment. Since the servo control frequency of the acceleration control does not have a limitation such as the position control, the servo control frequency may be set as high as possible to more reduce the deformation of the scale 1.

Further, the driving apparatuses 4a to 4d can be arranged in the vicinity of the supporting apparatuses 3a to 3d. In addition, the acceleration sensors 60a to 60d can be arranged in the vicinity of the driving apparatuses 4a to 4d that are driven in the plate thickness direction and the supporting apparatuses 3a to 3d. By the arrangement, in a case where the force transferred to the scale 1 from the supporting apparatuses 3a to 3d is offset from the force generated from the driving apparatuses 4a to 4d, the local deformation of the scale 1 occurring by a difference in points of application of each force can be reduced.

If the natural frequency fc of the supporting apparatus 3 is 2 Hz, the vibration of equal to or more than about 3 Hz (2 Hz×√2) is damped during the vibration of the lens barrel surface plate 9 and transferred to the scale 1. According to the present exemplary embodiment, even the vibration of which the frequency transferred to the scale 1 is equal to or less than 3 Hz can be reduced, and thus the deformation of the scale 1 may be more reduced, compared to the configuration of the first exemplary embodiment.

A third exemplary embodiment will now be described. A position measuring system according to a third exemplary embodiment will be described. The supporting apparatus according to the first exemplary embodiment sets the servo control frequency to equal to or less than ½ of the natural frequency fc, while the present exemplary embodiment sets the servo control frequency to equal to or more than √2 to less than 10 times of the natural frequency fc. In the following description, different portions from the first exemplary embodiment will be described and a description of portions having the same function as the first exemplary embodiment will be omitted.

If the servo control frequency is set to be a higher frequency than the natural frequency fc, the vibration is transferred in the frequency domain (domain of equal to or more than √2 times of fc in FIG. 9) in which the supporting apparatus 3 is difficult to transfer vibration. However, for example, by setting the servo control frequency to 5 to 10 Hz avoiding the vicinity (for example, 1 to 3 Hz) of the natural frequency fc, the vibration of the scale 1 due to the resonance can be reduced to suppress the deformation of the scale 1.

For example, if the servo control frequency is set to 10 Hz, the vibration up to 10 Hz of the lens barrel 19 is transferred, but the resonance of the scale 1 of about 1 to 3 Hz is suppressed, so that the inertial force generated in the scale 1 can be suppressed.

The servo control frequency may be set to equal to or more than $\sqrt{2}$ times of the natural frequency fc of the supporting apparatus 3, more advantageously, equal to or more than twice of the natural frequency fc. If the servo control frequency excessively approaches the natural frequency fc, the control is instable. Further, if the damping ratio of the supporting apparatus 3 is small, a vibration amplification ratio in the vicinity of the natural frequency fc is large, so that the anti-vibration effect if the present exemplary embodiment is performed is more remarkable. If the servo control frequency of the scale 1 is equal to or less than 10 times of the natural frequency fc of the supporting apparatus 3, the sufficient anti-vibration effect is obtained.

A fourth exemplary embodiment will now be described. A position measuring system according to the fourth exemplary embodiment will be described. A configuration of a supporting apparatus is different from the first exemplary embodiment. Specifically, the supporting apparatus according to the first exemplary embodiment is a non-contact type, while the supporting apparatus according to the present exemplary embodiment is a contact type. Similarly to the first exemplary embodiment, the supporting apparatus is configured to reduce the support rigidity (spring constant) in the plate thickness direction of the scale 1. In the following description, different portions from the first exemplary embodiment will be described, and a description of portions having the same function as the first exemplary embodiment will be omitted.

Figure 6:
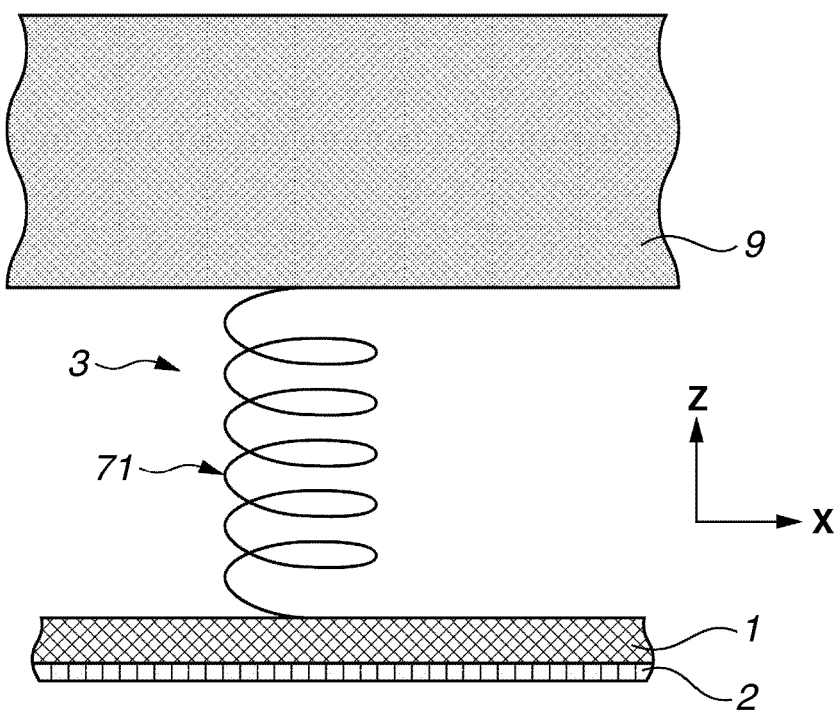
FIG. 6 is a schematic diagram of the supporting apparatus according to the present invention.

The supporting apparatus of FIG. 6 supports the scale 1 by a coil spring 71. The coil spring 71 is mounted on the scale 1 side at one end of the coil spring 71 and mounted on the lens barrel surface plate 9 side at the other end thereof. The coil spring 71 has low support rigidity (that is, performs flexible supporting) in the plate thickness direction (Z direction) of the scale 1 and also has low rigidity in an XY direction. Further, if the support rigidity of the coil spring is low, there is a need to perform a control so that an elongation of the coil spring due to the mass of the scale 1 is not excessively large in an initial state.

Figure 7:
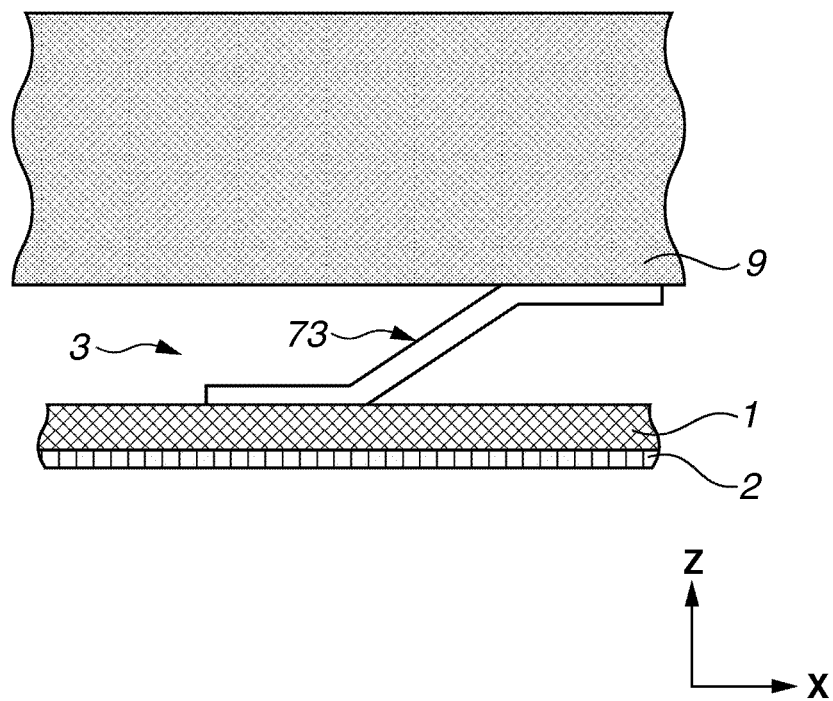
FIG. 7 is a schematic diagram of the supporting apparatus according to the present invention.

Further, as illustrated in FIG. 7, the scale 1 may also be supported by a leaf spring 73, instead of the coil spring 71 in FIG. 6.

A fifth exemplary embodiment will now be described. A position measuring system according to the fifth exemplary embodiment will be described. The position measuring system according to the fifth exemplary embodiment is different from the position measuring system according to the first exemplary embodiment in that the supporting apparatus according to the fifth exemplary embodiment is a contact type, while the supporting apparatus according to the first exemplary embodiment is a non-contact type. Since the supporting apparatus does not include a first feature of the first exemplary embodiment, the temperature change of the scale 1 easily occurs as compared to the configuration of the first exemplary embodiment, but since the supporting apparatus includes a second feature, the deformation of the scale 1 can be reduced. In the following description, different portions from the first exemplary embodiment will be described and a description of portions having the same function as the first exemplary embodiment will be omitted.

Figure 8A:
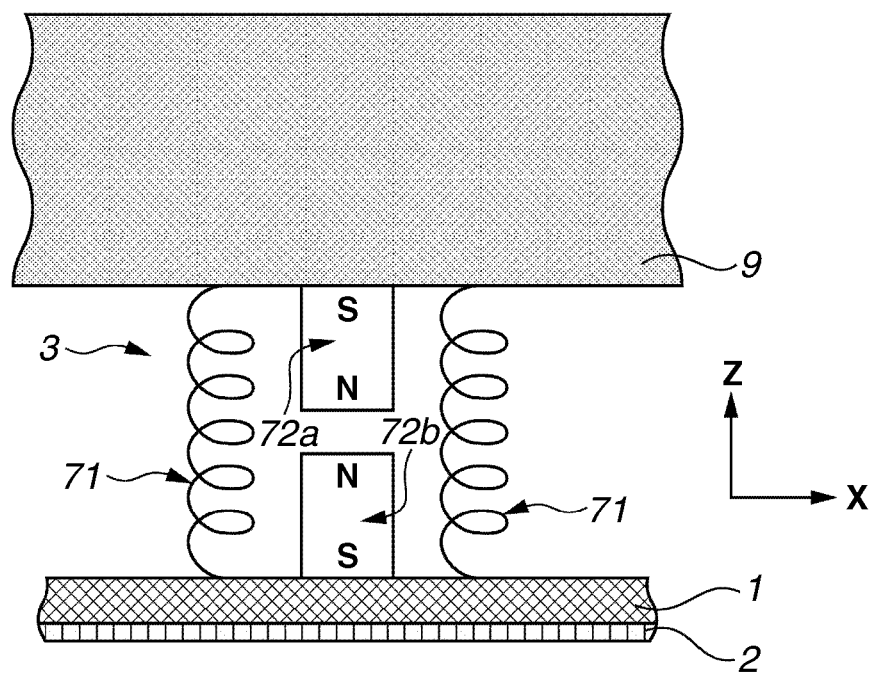
FIGS. 8A and 8B are diagrams respectively illustrating another example of a supporting apparatus according to the present invention.

FIG. 8A illustrates the supporting apparatus according to the fifth exemplary embodiment. FIG. 8A illustrates one supporting apparatus, but similarly to the first exemplary embodiment, the position measuring system includes a plurality of supporting apparatuses and another supporting apparatus (not illustrated) also has the same configuration.

The supporting apparatus includes a magnet 72a fixed to the lens barrel surface plate 9, a magnet 72b fixed to the scale 1 to face the magnet 72a, and the coil spring 71 that connects the lens barrel surface plate 9 with the scale 1. The magnets 72a and 72b each are a permanent magnet. Another configuration may be used in place of the coil spring 71 as long as the configuration functions as a spring element.

The scale 1 is supported by a magnetic repulsion force applied between the magnet 72a and the magnet 72b and a supporting force determined by a restoring force of the coil spring 71. The magnet 72a and the magnet 72b generate a spring force non-linear to a displacement of the scale 1, and the coil spring 71 is configured to generate a spring force linear to the same.

Further, the support force supporting the scale 1 is obtained by controlling the spring forces and the support position of the scale 1, and at the same time, the elongation of the coil spring 71 to the displacement in the vicinity of the balance position can be suppressed. This reduces a distance between the scale 1 and the lens barrel surface plate 9 to bring space saving. Further, the absolute value of the spring constant can also be reduced in the balance poison by the control.

Figure 8B:
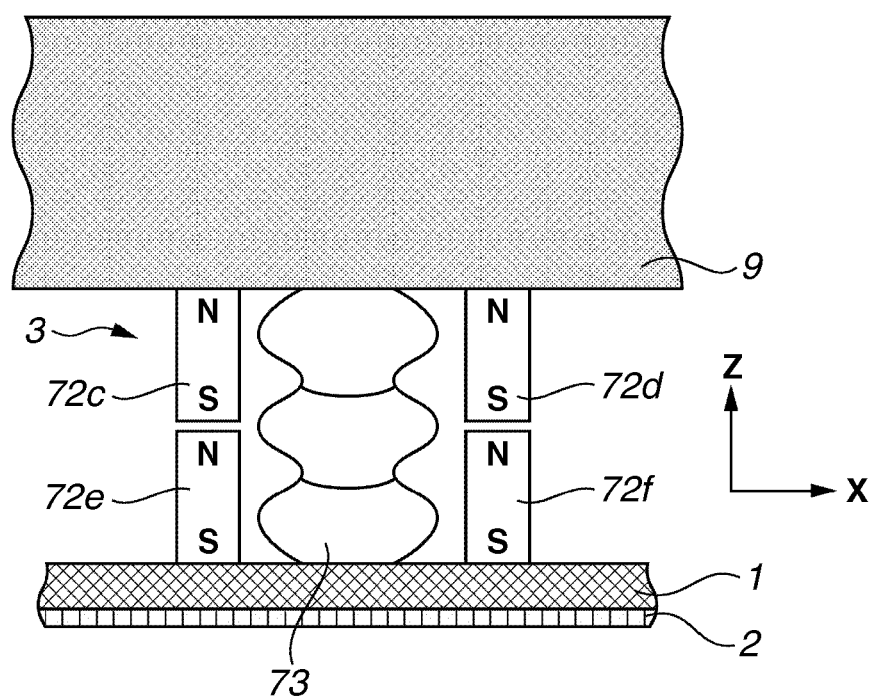

FIG. 8B is a modified example of FIG. 8A. The supporting apparatus illustrated in FIG. 8B uses an air spring (bellofram) 73, instead of the coil spring 71. Further, magnets 72c to 72f are used instead of the magnets 72a and 72b. The supporting apparatus is also different from the supporting apparatus of FIG. 8A in that the magnets 72c to 72f use a magnetic suction force.

A sixth exemplary embodiment will now be described. The present exemplary embodiment has the same configuration as the supporting apparatuses according to the first exemplary embodiment to the fifth exemplary embodiment, but has different characteristics from the first exemplary embodiment to the fifth exemplary embodiment. In the sixth exemplary embodiment, the supporting apparatus has a negative spring characteristic and is used at a position where the absolute value of the spring constant is small.

The supporting apparatus discussed in Japanese Patent Application Laid-Open No. 2009-004737 uses a deflection element, and therefore the mass of the deflection element (spring element) itself and the resonance by the spring constant are problematic. In the conventional example, even if the spring constant of the deflection element is extremely small, a plurality of natural frequency (resonance frequency) is present from the vicinity of several 10 Hz according to the mass of the deflection element itself and the vibration in the plate thickness direction transferred from the lens barrel surface plate 9 is amplified. The vibration causes the deformation of the scale 1.

Even in the first exemplary embodiment, as described with reference to FIG. 9, in the region (for example, 0.5 Hz to 3 Hz) in which the vibration frequency of the lens barrel surface plate 9 is in the vicinity of the natural frequency fc, the vibration of the lens barrel surface plate 9 is amplified as much as an amount in proportion to the damping ratio of the supporting apparatus 3 and is transferred to the scale 1. The above amplification is generated in the positive spring characteristic and in the present exemplary embodiment, the supporting apparatus has the negative spring characteristics, so that there is no resonance problem due to the amplification. Therefore, as compared to the first exemplary embodiment, the deformation of the scale 1 may be reduced.

The supporting apparatus having the negative spring characteristic does not have the general natural frequency since the spring constant is defined as negative. Therefore, as the frequency corresponding to the natural frequency, the following frequency fc is defined.

$$fc = \frac{1}{2\pi}\sqrt{\frac{|k|}{m}} \quad (1)$$

Equation (1) is a modification representing the general natural frequency, where the spring constant k is set to be an absolute value in Equation representing the natural frequency, and m is a mass of the scale 1 or a total mass of the scale 1 and an object mounted on the scale 1. In the case of the negative spring characteristic, the resonance phenomenon does not occur, and therefore the frequency fc does not have a meaning of a frequency that causes a resonance. However, Equation 1 can be a reference for determining how much the vibration becomes hard to be transferred due to the effect of the inertial force applied to the supported object or how much the spring force is applied to the supported object.

Herein, even if the spring constant is negative, the characteristic in which the vibration of the lens barrel surface plate 9 is hard to be transferred to the scale 1 owing to small absolute value of the spring constant, is not different from the case in which the spring constant is positive. The positioning control of the scale 1 in the present exemplary embodiment will now be described. Since the supporting apparatus 3 according to the present exemplary embodiment has the negative spring constant and the small absolute value of the spring constant, the acceleration is hardly generated in the scale 1, but the positional stability of the scale 1 becomes degraded. For example, it is possible that the scale 1 is displaced even by the effect of wind pressure involved in the movement of the substrate stage.

Therefore, the positioning control of the scale is performed by the same configuration as the first exemplary embodiment. In a case where the supporting apparatus has the positive spring characteristic, it is fear that the vibration of the positioning control of the scale 1 is amplified. Generally, in the region of ½ to √2 times of the natural frequency, it is difficult to perform the positioning control. On the other hand, in a case where the supporting apparatus has the negative spring characteristic, the resonance phenomenon does not occur at the frequency corresponding to the natural frequency, and even if the servo control frequency of the positioning control of the scale 1 is set to be near the frequency fc, no instability does not occur in the positioning control. However, in the negative spring characteristic, since the force in a direction far away from the balance position is applied, there is a need to control the servo control frequency so as to secure a control driving force at least enough to exceed the above force. The positioning control responds to the assumed relative displacement between the scale 1 and the lens barrel surface plate 9, but can be generally performed if the servo control frequency is set to be equal to or more than 1 time of the frequency fc corresponding to the natural frequency. On the other hand, in a case where the positioning control is performed in the servo control frequency smaller than 1 time of the frequency fc, the control driving force can be exceeded by the force generated by the negative spring, so that the positioning control may be easily instable.

Meanwhile, the positioning control of the scale 1 has a function to cause the scale 1 to follow the motion of the projection optical system 10, so that if the positioning control of the scale 1 is performed at the high servo control frequency, the vibration of the projection optical system 10 is excessively transferred.

Figure 11A:
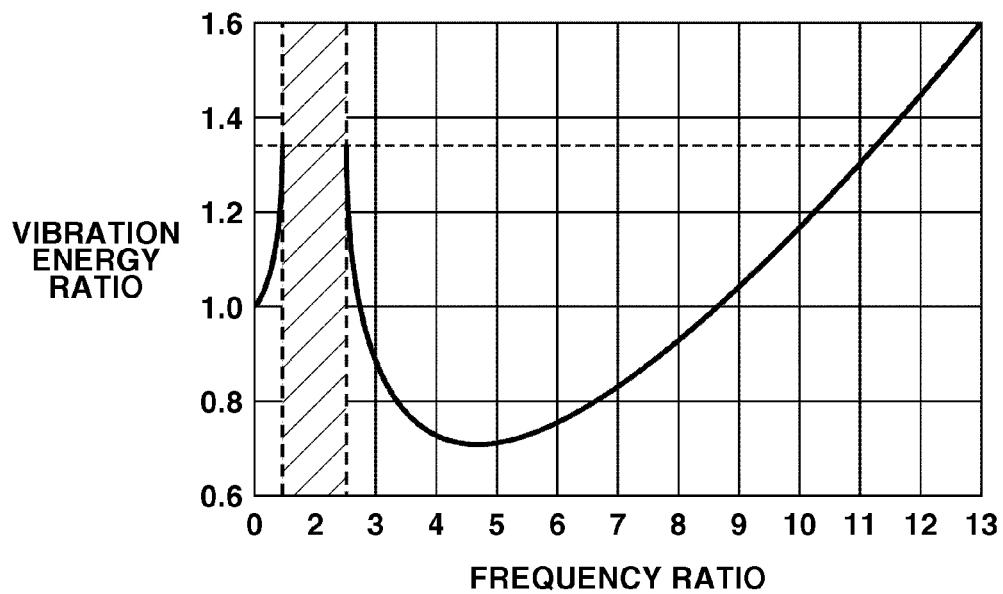
FIGS. 11A and 11B are diagrams respectively illustrating, in a case of positive and negative spring characteristics, a relationship between a servo control frequency of a positioning control of the scale and vibration energy applied to the scale.
Figure 11B:
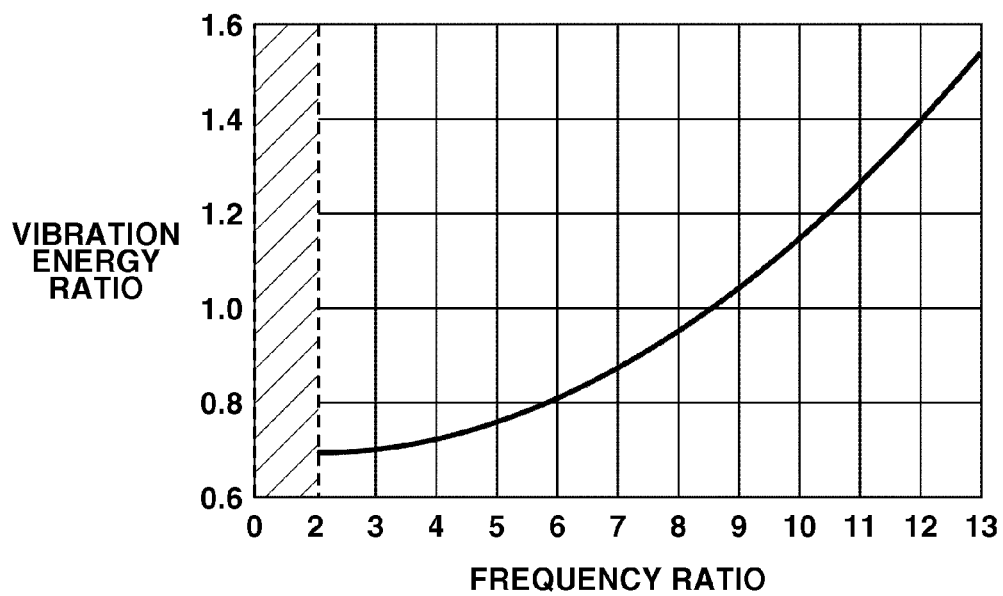

FIGS. 11A and 11B are diagrams illustrating the relationship between the servo control frequency of the positioning control of the scale 1 and the vibration energy applied to the scale 1. FIG. 11A illustrates the case in which the supporting apparatus 3 has the positive spring characteristic, and FIG. 11B illustrates the case in which the supporting apparatus 3 has the negative spring characteristic. A horizontal axis represents a frequency ratio and the frequency ratio is a ratio of the natural frequency or the frequency fc to the servo control frequency.

A vertical axis represents the vibration energy ratio, and a force transferred from the supporting apparatus 3 or a square of an amplitude if the scale 1 is vibrated by the control driving force is normalized by a value obtained in a case where the servo control is not performed while being supported by the supporting apparatus having the positive spring characteristic having the natural frequency of 2 Hz. If the servo control frequency is 0 (if the servo control is not performed), the vibration energy ratio becomes 1.0 since the normalization is performed. The graph can be construed as illustrating a graph in which the vibration energy applied to the scale 1 is normalized, in a case where the positioning control is performed at each servo control frequency.

It can be appreciated from FIG. 11A that if the supporting apparatus having the positive spring characteristic sets the servo control frequency to about 2 to 4 times of the natural frequency, the vibration energy applied to the scale 1 is reduced, in other words, the anti-vibration effect is maximized. Further, it can be appreciated that if the servo control frequency is set to equal to or more than 10 times of the natural frequency, the vibration energy applied to the scale 1 is more increased as compared with the positioning control at the servo control frequency in the vicinity of the natural frequency, thereby deteriorating the anti-vibration effect.

It can be appreciated from FIG. 11B that in the supporting apparatus having the negative spring characteristic, as the servo control frequency is increased, the vibration energy applied to the scale 1 is increased, thereby deteriorating the anti-vibration effect. Further, it can be appreciated that if the servo control frequency is set to be about 1 to 3 times of the frequency fc, the anti-vibration is highly effective. If the servo control frequency is set to equal to or more than 10 times of fc, the anti-vibration effect is not different from the case of the supporting apparatus of the positive spring characteristic.

To summarize the above description, it can be appreciated that in the supporting apparatus 3 having the negative spring characteristics, the servo control frequency of the positioning control of the scale 1 is advantageously set to equal to or more than 1 to equal to or less than 10 times of the frequency fc. Further, it is more advantageous to set the servo control frequency to equal to or more than 1 to equal to or less than 3 times of the frequency fc. In the present exemplary embodiment, as one example, the frequency fc of the supporting apparatus is set to about 2 Hz in all the six axial directions and the servo control frequency is set to about 3 to 5 Hz.

The "servo control frequency" (referred to as servo control band) is defined by a zero cross frequency in an open characteristic and is an index that indicates a boundary as to whether a follow-up control is sufficiently operated. Specifically, if the servo control frequency is set to 5 Hz, the follow-up control does not perform on the motion of a frequency of equal to or more than 5 Hz, but perform on a motion of the lens barrel at a frequency of less than 5 Hz to prevent the drift of the low frequency band at the position of the scale 1.

The supporting apparatus 3 according to the present exemplary embodiment has the negative spring characteristic in the plate thickness direction of the scale 1 and sets the servo control frequency for performing the positioning control on the scale 1 to equal to or more than 1 to equal to or less than 10 times of the frequency fc. Therefore, the inertial force generated by the scale 1 can be suppressed by the positioning control of the scale 1 to remarkably reduce the deformation in the plate thickness direction of the scale 1 due to the vibration.

Method for Manufacturing Device

Next, a method for manufacturing a device (semiconductor device, liquid crystal device, and the like) according to an exemplary embodiment of the present invention will be described. The semiconductor device is manufactured by performing a pre-process that makes an integrated circuit on a wafer and a post-process that completes an integrated circuit chip on the wafer manufactured in the pre-process as a product. The pre-process includes a process of exposing the wafer to which a photosensitive material is applied by using the foregoing exposure apparatus and a process of developing the wafer. The post-process includes an assembly process (dicing, bonding) and a packaging process (encapsulating). The liquid crystal device is manufactured by performing a process of forming a transparent electrode. The process of forming the transparent electrode includes a process of applying a photosensitive material to a glass substrate on which a transparent conductive film is deposited, a process of exposing the glass substrate to which the photosensitive material is applied by using the foregoing exposure apparatus, and a process of developing the glass substrate. According to the method for manufacturing a device according to the present exemplary embodiment, the higher-quality device than the related art may be manufactured.

As described above, the exemplary embodiment of the present invention is described, but is not limited thereto and can be variously modified and changed in the scope of the present invention.

According to the present invention, in the positioning control apparatus including the scale and the sensor, it is possible to improve the measurement precision by reducing the deformation in the plate thickness direction of the scale.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2012-096941 filed Apr. 20, 2012, and Japanese Patent Application No. 2012-096942 filed Apr. 20, 2012, each of which is hereby incorporated by reference herein in its entirety.

What is claimed is:

1. A position measuring apparatus for measuring a position of a measured object, the position measuring apparatus comprising:
 a sensor head provided on the measured object;
 a scale irradiated with light from the sensor head and having a thickness in a direction of gravitational force;
 a structure supported by a floor via a vibration isolation apparatus that reduces vibration transferred from the floor to the structure; and
 a supporting unit disposed between the structure and the scale, and configured to support the scale in the direction,
 wherein the supporting unit includes a spring element having a spring constant that reduces vibration, transferred from the floor to the scale through the vibration isolation apparatus and the structure, in the direction,
 wherein, in a case where a mass of an object including the scale and supported by the supporting unit is set to m and the spring constant of the supporting unit is set to k, a frequency fc in the direction represented by the following Equation is set to a value equal to or less than 10 Hz, $$fc = \frac{1}{2\pi} \cdot \sqrt{\frac{|k|}{m}}$$

wherein the position measuring apparatus comprises a position sensor configured to measure a relative position in the direction between the structure or a reference object mounted on the structure and the scale,
 wherein the position measuring apparatus further comprises a driving unit configured to drive the object including the scale in the direction based on an output from the position sensor,
 wherein the supporting unit has a negative spring constant, and
 wherein a servo control frequency for positioning the object including the scale in the direction by the driving unit and the position sensor is set to a value, not less than 1 and not greater than 10, times the fc.

2. A position measuring apparatus for measuring a position of a measured object, the position measuring apparatus comprising:
 a sensor head provided on the measured object;
 a scale irradiated with light from the sensor head and having a thickness in a direction of gravitational force;
 a structure supported by a floor via a vibration isolation apparatus that reduces vibration transferred from the floor to the structure; and
 a supporting unit disposed between the structure and the scale, and configured to support the scale in the direction,
 wherein the supporting unit includes a spring element having a spring constant that reduces vibration, transferred from the floor to the scale through the vibration isolation apparatus and the structure, in the direction,
 wherein, in a case where a mass of an object including the scale and supported by the supporting unit is set to m and the spring constant of the supporting unit is set to k, a frequency fc in the direction represented by the following Equation is set to a value equal to or less than 10 Hz, $$fc = \frac{1}{2\pi} \cdot \sqrt{\frac{|k|}{m}}$$

wherein the position measuring apparatus comprises a position sensor configured to measure a relative position in the direction between the structure or a reference object mounted on the structure and the scale, wherein the position measuring apparatus further comprises a driving unit configured to drive the object including the scale in the direction based on an output from the position sensor, wherein the supporting unit has a positive spring constant, and wherein a servo control frequency for positioning the object including the scale in the direction by the driving unit and the position sensor is set to a value, not greater than ½ or not less than √2 and not greater than 10, times the fc.

3. An apparatus for forming a pattern on a substrate, the apparatus comprising:

a stage configured to be movable and hold the substrate; and a position measuring apparatus configured to measure a position of the stage, wherein the position measuring apparatus comprises:

a sensor head provided on a measured object, a scale irradiated with light from the sensor head and having a thickness in a direction of gravitational force, a structure supported by a floor via a vibration isolation apparatus that reduces vibration transferred from the floor to the structure, and a supporting unit disposed between the structure and the scale, and configured to support the scale in the direction, wherein the supporting unit includes a spring element having a spring constant that reduces vibration, transferred from the floor to the scale through the vibration isolation apparatus and the structure, in the direction, wherein, in a case where a mass of an object including the scale and supported by the supporting unit is set to m and the spring constant of the supporting unit is set to k, a frequency fc in the direction represented by the following Equation is set to a value equal to or less than 10 Hz, $$fc = \frac{1}{2\pi} \cdot \sqrt{\frac{|k|}{m}}$$

wherein the position measuring apparatus comprises a position sensor configured to measure a relative position in the direction between the structure or a reference object mounted on the structure and the scale, wherein the position measuring apparatus further comprises a driving unit configured to drive the object including the scale in the direction based on an output from the position sensor, wherein the supporting unit has a negative spring constant, and wherein a servo control frequency for positioning the object including the scale in the direction by the driving unit and the position sensor is set to a value, not less than 1 and not greater than 10, times the fc.

4. An apparatus for forming a pattern on a substrate, the apparatus comprising:

a stage configured to be movable and hold the substrate; and a position measuring apparatus configured to measure a position of the stage, wherein the position measuring apparatus comprises:

a sensor head provided on a measured object, a scale irradiated with light from the sensor head and having a thickness in a direction of gravitational force, a structure supported by a floor via a vibration isolation apparatus that reduces vibration transferred from the floor to the structure, and a supporting unit disposed between the structure and the scale, and configured to support the scale in the direction, wherein the supporting unit includes a spring element having a spring constant that reduces vibration, transferred from the floor to the scale through the vibration isolation apparatus and the structure, in the direction, wherein, in a case where a mass of an object including the scale and supported by the supporting unit is set to m and the spring constant of the supporting unit is set to k, a frequency fc in the direction represented by the following Equation is set to a value equal to or less than 10 Hz, $$fc = \frac{1}{2\pi} \cdot \sqrt{\frac{|k|}{m}}$$

wherein the position measuring apparatus comprises a position sensor configured to measure a relative position in the direction between the structure or a reference object mounted on the structure and the scale, wherein the position measuring apparatus further comprises a driving unit configured to drive the object including the scale in the direction based on an output from the position sensor, wherein the supporting unit has a positive spring constant, and wherein a servo control frequency for positioning the object including the scale in the direction by the driving unit and the position sensor is set to a value, not greater than ½ or not less than √2 and not greater than 10, times the fc.

5. A method of manufacturing a device, the method comprising:

forming a pattern on a substrate using an apparatus; and developing the substrate, on which the pattern has been formed, to manufacture the device, wherein the apparatus comprises:

a stage configured to be movable and hold the substrate, and a position measuring apparatus configured to measure a position of the stage, wherein the position measuring apparatus comprises:

a sensor head provided on a measured object, a scale irradiated with light from the sensor head and having a thickness in a direction of gravitational force, a structure supported by a floor via a vibration isolation apparatus that reduces vibration transferred from the floor to the structure, and a supporting unit disposed between the structure and the scale, and configured to support the scale in the direction, wherein the supporting unit includes a spring element having a spring constant that reduces vibration, transferred from the floor to the scale through the vibration isolation apparatus and the structure, in the direction, wherein, in a case where a mass of an object including the scale and supported by the supporting unit is set to m and the spring constant of the supporting unit is set to k, a frequency fc in the direction represented by the following Equation is set to a value equal to or less than 10 Hz, $$fc = \frac{1}{2\pi} \cdot \sqrt{\frac{|k|}{m}}$$

wherein the position measuring apparatus comprises a position sensor configured to measure a relative position in the direction between the structure or a reference object mounted on the structure and the scale, wherein the position measuring apparatus further comprises a driving unit configured to drive the object including the scale in the direction based on an output from the position sensor, wherein the supporting unit has a negative spring constant, and wherein a servo control frequency for positioning the object including the scale in the direction by the driving unit and the position sensor is set to a value, not less than 1 and not greater than 10, times the fc.

6. A method of manufacturing a device, the method comprising:

forming a pattern on a substrate using an apparatus; and developing the substrate, on which the pattern has been formed, to manufacture the device, wherein the apparatus comprises:

a stage configured to be movable and hold the substrate, and a position measuring apparatus configured to measure a position of the stage, wherein the position measuring apparatus comprises:

a sensor head provided on a measured object, a scale irradiated with light from the sensor head and having a thickness in a direction of gravitational force, a structure supported by a floor via a vibration isolation apparatus that reduces vibration transferred from the floor to the structure, and a supporting unit disposed between the structure and the scale, and configured to support the scale in the direction, wherein the supporting unit includes a spring element having a spring constant that reduces vibration, transferred from the floor to the scale through the vibration isolation apparatus and the structure, in the direction, wherein, in a case where a mass of an object including the scale and supported by the supporting unit is set to m and the spring constant of the supporting unit is set to k, a frequency fc in the direction represented by the following Equation is set to a value equal to or less than 10 Hz, $$fc = \frac{1}{2\pi} \cdot \sqrt{\frac{|k|}{m}}$$

wherein the position measuring apparatus comprises a position sensor configured to measure a relative position in the direction between the structure or a reference object mounted on the structure and the scale, wherein the position measuring apparatus further comprises a driving unit configured to drive the object including the scale in the direction based on an output from the position sensor, wherein the supporting unit has a positive spring constant, and wherein a servo control frequency for positioning the object including the scale in the direction by the driving unit and the position sensor is set to a value, not greater than ½ or not less than √2 and not greater than 10, times the fc.

7. A positioning measuring apparatus for measuring a position of a measured object, the positioning measuring apparatus comprising:

a sensor head provided to the measured object;

a scale irradiated with light from the sensor head and having a thickness in a direction of gravitational force;

a structure supported by a floor via a vibration isolation apparatus that reduces vibration transferred from the floor to the structure; and supporting means having a spring constant to support the scale in the direction so that vibration, transferred from the floor to the scale through the vibration isolation apparatus and the structure, in the direction is reduced via the supporting means, wherein, in a case where a mass of an object including the scale and supported by the supporting means is set to m and the spring constant of the supporting means is set to k, a frequency fc in the direction represented by the following Equation is set to a value equal to or less than 10 Hz, $$fc = \frac{1}{2\pi} \cdot \sqrt{\frac{|k|}{m}}$$

wherein the position measuring apparatus comprises a position sensor configured to measure a relative position in the direction between the structure or a reference object mounted on the structure and the scale, wherein the position measuring apparatus further comprises a driving unit configured to drive the object including the scale in the direction based on an output from the position sensor, wherein the supporting means has a negative spring constant, and wherein a servo control frequency for positioning the object including the scale in the direction by the driving unit and the position sensor is set to a value, not less than 1 and not greater than 10, times the fc.

8. A positioning measuring apparatus for measuring a position of a measured object, the positioning measuring apparatus comprising:

a sensor head provided to the measured object;

a scale irradiated with light from the sensor head and having a thickness in a direction of gravitational force;

a structure supported by a floor via a vibration isolation apparatus that reduces vibration transferred from the floor to the structure; and supporting means having a spring constant to support the scale in the direction so that vibration, transferred from the floor to the scale through the vibration isolation apparatus and the structure, in the direction is reduced via the supporting means, wherein, in a case where a mass of an object including the scale and supported by the supporting means is set to m and the spring constant of the supporting means is set to k, a frequency fc in the direction represented by the following Equation is set to a value equal to or less than 10 Hz, $$fc = \frac{1}{2\pi} \cdot \sqrt{\frac{|k|}{m}}$$

wherein the position measuring apparatus comprises a position sensor configured to measure a relative position in the direction between the structure or a reference object mounted on the structure and the scale, wherein the position measuring apparatus further comprises a driving unit configured to drive the object including the scale in the direction based on an output from the position sensor, wherein the supporting means has a positive spring constant, and wherein a servo control frequency for positioning the object including the scale in the direction by the driving unit and the position sensor is set to a value, not greater than ½ or not less than √2 and not greater than 10, times the fc.

* * * * *